(12) United States Patent
French et al.

(10) Patent No.: US 10,797,628 B2
(45) Date of Patent: *Oct. 6, 2020

(54) GAS TURBINE ENGINE AND ELECTRICAL SYSTEM

(71) Applicants: Rolls-Royce North American Technologies, Inc., Indianapolis, IN (US); Rolls-Royce Corporation, Indianapolis, IN (US)

(72) Inventors: Mat French, Avon, IN (US); John T. Alt, Zionsville, IN (US); Mark J. Blackwelder, Plainfield, IN (US)

(73) Assignees: Rolls-Royce North American Technologies, Inc., Indianapolis, IN (US); Rolls-Royce Corporation, Indianapolis, IN (US)

(*) Notice: Subject to any disclaimer, the term of this patent is extended or adjusted under 35 U.S.C. 154(b) by 637 days.

This patent is subject to a terminal disclaimer.

(21) Appl. No.: 15/459,577

(22) Filed: Mar. 15, 2017

(65) Prior Publication Data

US 2017/0187311 A1  Jun. 29, 2017

Related U.S. Application Data

(63) Continuation of application No. 14/135,567, filed on Dec. 19, 2013, now Pat. No. 9,601,970.

(Continued)

(51) Int. Cl.
*H02P 9/48* (2006.01)
*F02C 9/00* (2006.01)
(Continued)

(52) U.S. Cl.
CPC .................. *H02P 9/48* (2013.01); *B81B 7/02* (2013.01); *B81C 1/00158* (2013.01);
(Continued)

(58) Field of Classification Search
CPC .. F01D 15/10; F02C 6/14; F02C 7/268; F02C 7/275; F02C 7/32; H02K 7/1823; H02P 2101/25; H02P 2101/30
See application file for complete search history.

(56) References Cited

U.S. PATENT DOCUMENTS

| | | | |
|---|---|---|---|
| 5,694,765 | A | 12/1997 | Hield et al. |
| 5,867,979 | A | 2/1999 | Newton et al. |

(Continued)

FOREIGN PATENT DOCUMENTS

| | | | |
|---|---|---|---|
| EP | 2472084 A2 | 7/2012 | |
| EP | 2492451 A2 | 8/2012 | |

(Continued)

OTHER PUBLICATIONS

Int'l. Search Report for PCT/US2013/071756 dated Apr. 4, 2014.

*Primary Examiner* — Scott J Walthour
(74) *Attorney, Agent, or Firm* — Fishman Stewart PLLC

(57) ABSTRACT

A gas turbine engine includes first and second electrical machines coupled to the gas turbine engine, each of the first and second electrical machines electrically coupled to both a primary electrical bus and a secondary electrical bus. The gas turbine includes a first controller configured to control operation of the gas turbine engine, and a second controller coupled to the first controller, the second controller configured to respond to control inputs from the first controller and control an electrical output of the first and second electrical machines to the primary and secondary electrical busses. A converter controller is coupled to an energy storage system, the second controller, the primary electrical bus, and the secondary electrical bus.

17 Claims, 2 Drawing Sheets

Related U.S. Application Data

(60) Provisional application No. 61/780,940, filed on Mar. 13, 2013.

(51) Int. Cl.
| | | |
|---|---|---|
| *F02C 7/32* | (2006.01) | |
| *H02K 7/18* | (2006.01) | |
| *F01D 15/10* | (2006.01) | |
| *F02C 7/36* | (2006.01) | |
| *H02J 9/06* | (2006.01) | |
| *F02C 7/268* | (2006.01) | |
| *B81B 7/02* | (2006.01) | |
| *B81C 1/00* | (2006.01) | |
| *F02K 3/06* | (2006.01) | |
| *F02N 11/08* | (2006.01) | |
| *H02P 101/30* | (2015.01) | |
| *H02P 101/25* | (2016.01) | |
| *H02J 1/10* | (2006.01) | |
| *H02J 3/30* | (2006.01) | |
| *H02J 3/32* | (2006.01) | |
| *H02J 1/16* | (2006.01) | |
| *H02J 3/38* | (2006.01) | |

(52) U.S. Cl.
CPC .......... *B81C 1/00301* (2013.01); *F01D 15/10* (2013.01); *F02C 7/268* (2013.01); *F02C 7/32* (2013.01); *F02C 7/36* (2013.01); *F02C 9/00* (2013.01); *F02K 3/06* (2013.01); *F02N 11/0862* (2013.01); *H02J 9/061* (2013.01); *H02K 7/1823* (2013.01); *B81B 2201/0257* (2013.01); *B81B 2201/0264* (2013.01); *F05B 2220/706* (2013.01); *F05D 2220/76* (2013.01); *F05D 2270/62* (2013.01); *H02J 1/102* (2013.01); *H02J 1/16* (2013.01); *H02J 3/30* (2013.01); *H02J 3/32* (2013.01); *H02J 3/38* (2013.01); *H02P 2101/25* (2015.01); *H02P 2101/30* (2015.01)

(56) References Cited

U.S. PATENT DOCUMENTS

| | | | |
|---|---|---|---|
| 7,285,871 | B2 | 10/2007 | Derouineau |
| 7,468,561 | B2 | 12/2008 | Kern et al. |
| 7,521,902 | B2 | 4/2009 | Wiegman et al. |
| 7,538,521 | B2 | 5/2009 | Berenger |
| 7,605,483 | B2 | 10/2009 | Kern et al. |
| 7,936,086 | B2 | 5/2011 | Yue et al. |
| 9,601,970 | B2 * | 3/2017 | French ............... F01D 15/10 |
| 2004/0129835 | A1 * | 7/2004 | Atkey ............... B64D 41/00 |
| | | | 244/118.5 |
| 2009/0224599 | A1 | 9/2009 | Yue et al. |
| 2009/0302153 | A1 | 12/2009 | Matasso et al. |
| 2010/0066165 | A1 | 3/2010 | Ganev et al. |
| 2010/0102625 | A1 | 4/2010 | Karimi et al. |
| 2010/0133813 | A1 | 6/2010 | Cote et al. |
| 2010/0270858 | A1 | 10/2010 | Foch et al. |
| 2011/0154830 | A1 | 6/2011 | Bowman et al. |
| 2013/0031912 | A1 | 2/2013 | Finney et al. |

FOREIGN PATENT DOCUMENTS

| | | |
|---|---|---|
| FR | 2882097 A1 | 8/2006 |
| GB | 2237904 A1 | 5/1991 |

* cited by examiner

GAS TURBINE ENGINE AND ELECTRICAL SYSTEM

CROSS-REFERENCE TO RELATED APPLICATIONS

This application is a continuation application of U.S. patent application Ser. No. 14/135,567 file Dec. 19, 2013, which claims priority to U.S. Provisional Patent Application Ser. No. 61/780,940 filed Mar. 13, 2013, the contents of which are hereby incorporated in their entirety.

GOVERNMENT RIGHTS

The present application was made with the United States government support under Contract No. FA8650-09-C-2938, awarded by the United States Air Force. The United States government has certain rights in the present application.

FIELD OF THE DISCLOSURE

The present disclosure relates to gas turbine engines, and more particularly to gas turbine engines having electrical systems.

BACKGROUND

Gas turbine engine spools that generate electrical power remain an area of interest. Some existing systems have various shortcomings, drawbacks, and disadvantages relative to certain applications. Accordingly, there remains a need for further contributions in this area of technology.

SUMMARY

One embodiment of the present disclosure is a unique gas turbine engine. Another embodiment of the present disclosure is a unique machine. Other embodiments include apparatuses, systems, devices, hardware, methods, and combinations for gas turbine engines and electrical systems. Further embodiments, forms, features, aspects, benefits, and advantages of the present application will become apparent from the description and figures provided herewith.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
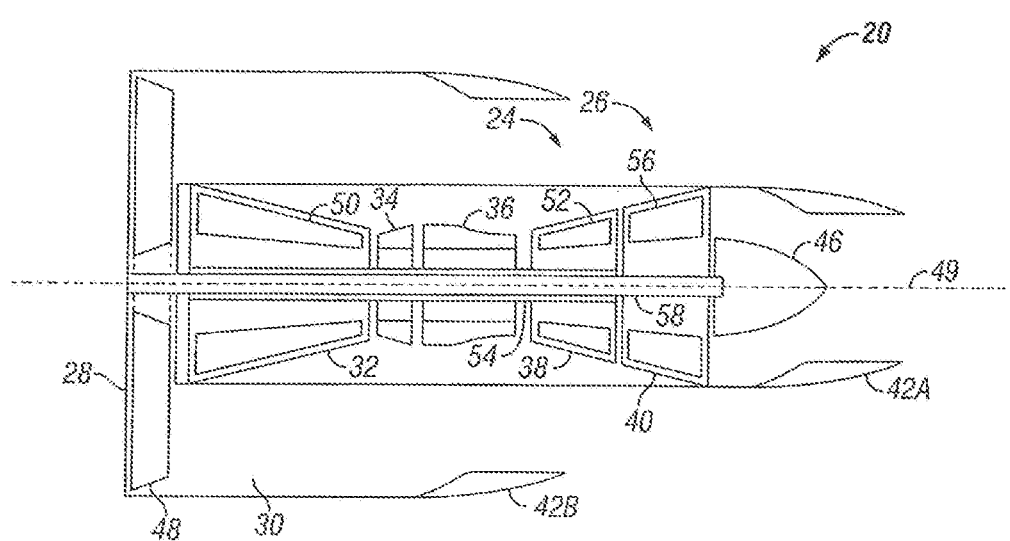
FIG. 1 schematically illustrates some aspects of non-limiting example of a gas turbine engine in accordance with an embodiment of the present disclosure.

For purposes of promoting an understanding of the principles of the disclosure, reference will now be made to the embodiments illustrated in the drawings, and specific language will be used to describe the same. It will nonetheless be understood that no limitation of the scope of the disclosure is intended by the illustration and description of certain embodiments of the disclosure. In addition, any alterations and/or modifications of the illustrated and/or described embodiment(s) are contemplated as being within the scope of the present disclosure. Further, any other applications of the principles of the disclosure, as illustrated and/or described herein, as would normally occur to one skilled in the art to which the disclosure pertains, are contemplated as being within the scope of the present disclosure.

Referring to the drawings, and in particular FIG. 1, there are illustrated some aspects of a non-limiting example of a gas turbine engine 20 in accordance with an embodiment of the present disclosure. In one form, engine 20 is a propulsion engine, e.g., an aircraft propulsion engine. In other embodiments, engine 20 may be any other type of gas turbine engine, e.g., a marine gas turbine engine, an industrial or power generation gas turbine engine, or any aero, aero-derivative or non-aero derivative gas turbine engine. In one form, engine 20 is a two spool engine having a high pressure (HP) spool (rotor) 24 and a low pressure (LP) spool (rotor) 26. In other embodiments, engine 20 may include only a single spool, or may include three or more spools, e.g., may include an intermediate pressure (IP) spool and/or other spools and/or partial spools, e.g., on-axis or off-axis compressor and/or turbine stages (i.e., stages that rotate about an axis that is the same or different than that of the primary spool(s)). In one form, engine 20 is a turbofan engine. In other embodiments, engine 20 may be any other type of gas turbine engine, such as a turboprop engine, a turboshaft engine, a propfan engine, a turbojet engine or a hybrid or combined cycle engine. As a turbofan engine, LP spool 26 is operative to drive a propulsor 28 in the form of a turbofan (fan) system, which may be referred to as a turbofan, a fan or a fan system. As a turboprop engine, LP spool 26 powers a propulsor 28 in the form of a propeller system (not shown), e.g., via a reduction gearbox (not shown). As a propfan engine, LP spool 26 powers a propulsor 28 in the form of a propfan. In other embodiments, propulsor 28 may take other forms, such as one or more helicopter rotors or tilt-wing aircraft rotors, for example, powered by one or more engines 20 in the form of one or more turboshaft engines.

In one form, engine 20 includes, in addition to fan 28, a bypass duct 30, a compressor 32, a diffuser 34, a combustor 36, a high pressure (HP) turbine 38, a low pressure (LP) turbine 40, a nozzle 42A, a nozzle 42B, and a tailcone 46, which are generally disposed about and/or rotate about an engine centerline 49. In other embodiments, there may be, for example, an intermediate pressure spool having an intermediate pressure turbine or other turbomachinery components, such as those mentioned above. In one form, engine centerline 49 is the axis of rotation of fan 28, compressor 32, turbine 38 and turbine 40. In other embodiments, one or more of fan 28, compressor 32, turbine 38 and turbine 40 may rotate about a different axis of rotation.

In the depicted embodiment, engine 20 core flow is discharged through nozzle 42A, and the bypass flow from fan 28 is discharged through nozzle 42B. In other embodiments, other nozzle arrangements may be employed, e.g., a common nozzle for core and bypass flow; a nozzle for core flow, but no nozzle for bypass flow; or another nozzle arrangement. Bypass duct 30 and compressor 32 are in fluid communication with fan 28. Nozzle 42B is in fluid communication with bypass duct 30. Diffuser 34 is in fluid communication with compressor 32. Combustor 36 is fluidly disposed between compressor 32 and turbine 38. Turbine 40 is fluidly disposed between turbine 38 and nozzle 42A. In one form, combustor 36 includes a combustion liner (not shown) that contains a continuous combustion process. In other embodiments, combustor 36 may take other forms, and may be, for example, a wave rotor combustion system, a rotary valve combustion system, a pulse detonation combustion system, a continuous detonation combustion system and/or a slinger combustion system, and may employ deflagration and/or detonation combustion processes.

Fan system 28 includes a fan rotor system 48 driven by LP spool 26. In various embodiments, fan rotor system 48 may include one or more rotors (not shown) that are powered by turbine 40. In various embodiments, fan 28 may include one or more fan vane stages (not shown in FIG. 1) that cooperate with fan blades (not shown) of fan rotor system 48 to compress air and to generate a thrust-producing flow. Bypass duct 30 is operative to transmit a bypass flow generated by fan 28 around the core of engine 20. Compressor 32 includes a compressor rotor system 50. In various embodiments, compressor rotor system 50 includes one or more rotors (not shown) that are powered by turbine 38. Compressor 32 also includes a plurality of compressor vane stages (not shown in FIG. 1) that cooperate with compressor blades (not shown) of compressor rotor system 50 to compress air. In various embodiments, the compressor vane stages may include a compressor discharge vane stage and/or one or more diffuser vane stages. In one form, the compressor vane stages are stationary. In other embodiments, one or more vane stages may be replaced with one or more counter-rotating blade stages.

Turbine 38 includes a turbine rotor system 52. In various embodiments, turbine rotor system 52 includes one or more rotors having turbine blades (not shown) operative to extract power from the hot gases flowing through turbine 38 (not shown), to drive compressor rotor system 50. Turbine 38 also includes a plurality of turbine vane stages (not shown) that cooperate with the turbine blades of turbine rotor system 52 to extract power from the hot gases discharged by combustor 36. In one form, the turbine vane stages are stationary. In other embodiments, one or more vane stages may be replaced with one or more counter-rotating blade stages. Turbine rotor system 52 is drivingly coupled to compressor rotor system 50 via a shafting system 54. Turbine 40 includes a turbine rotor system 56. In various embodiments, turbine rotor system 56 includes one or more rotors having turbine blades (not shown) operative to drive fan rotor system 48. Turbine 40 also includes a plurality of turbine vane stages (not shown in FIG. 1) that cooperate with the turbine blades of turbine rotor system 56 to extract power from the hot gases discharged by turbine 38. In one form, the turbine vane stages are stationary. In other embodiments, one or more vane stages may be replaced with one or more counter-rotating blade stages. Turbine rotor system 56 is drivingly coupled to fan rotor system 48 via a shafting system 58. In various embodiments, shafting systems 54 and 58 include a plurality of shafts that may rotate at the same or different speeds and directions for driving fan rotor system 48 rotor(s) and compressor rotor system 50 rotor(s). In some embodiments, only a single shaft may be employed in one or both of shafting systems 54 and 58. Turbine 40 is operative to discharge the engine 20 core flow to nozzle 42A.

During normal operation of gas turbine engine 20, air is drawn into the inlet of fan 28 and pressurized. Some of the air pressurized by fan 28 is directed into compressor 32 as core flow, and some of the pressurized air is directed into bypass duct 30 as bypass flow. Compressor 32 further pressurizes the portion of the air received therein from fan 28, which is then discharged into diffuser 34. Diffuser 34 reduces the velocity of the pressurized air, and directs the diffused core airflow into combustor 36. Fuel is mixed with the pressurized air in combustor 36, which is then combusted. The hot gases exiting combustor 36 are directed into turbines 38 and 40, which extract energy in the form of mechanical shaft power to drive compressor 32 and fan 28 via respective shafting systems 54 and 58. The hot gases exiting turbine 40 are discharged through nozzle system 42A, and provide a component of the thrust output by engine 20.

Figure 2:
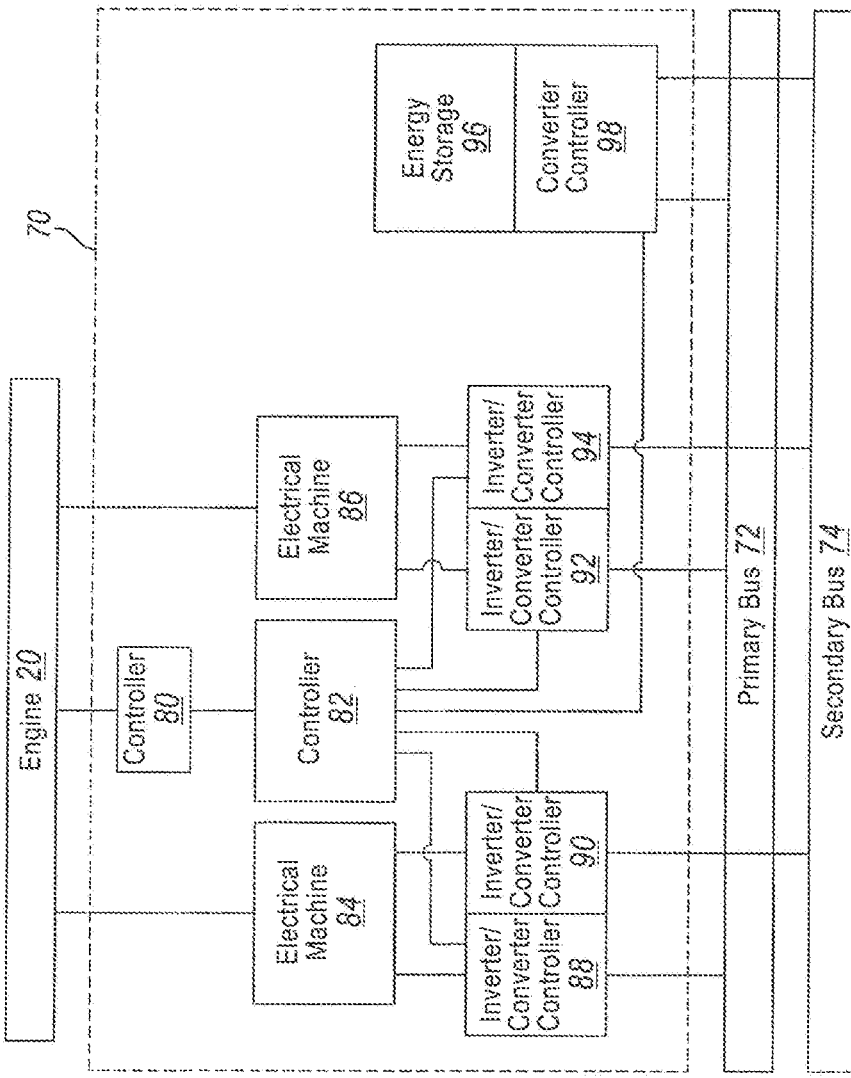
FIG. 2 schematically illustrates some aspects of a non-limiting example of an electrical system employed in conjunction with the gas turbine engine of FIG. 1 in accordance with an embodiment of the present disclosure.

Referring to FIG. 2, some aspects of a non-. limiting example of an electrical system 70 employed with engine 20 are schematically illustrated. In one form, electrical system 70 is configured to both start engine 20 and to generate electrical power for one or more electrical buses, e.g., primary and secondary electrical bus networks 72 and 74 that supply electrical power to one or more flight control systems, actuators, weapon systems and/or other systems, e.g., in an air vehicle. In other embodiments, power may be supplied to other electrical buses for other purposes. In some embodiments, electrical system 70 may not be configured to start engine 20, but rather, may be configured only to generate electrical power for one or more electrical buses. Electrical system 70 includes a controller 80, a controller 82, an electrical machine 84, an electrical machine 86, an inverter/converter controller 88, an inverter/converter controller 90, an inverter/converter controller 92, an inverter/converter controller 94, an energy storage system 96 and a converter controller 98.

In one form, electrical system 70 is configured to supply power in parallel to electrical buses 72 and 74. Electrical system is configured to regulate the voltage of the electrical bus 72 and/or electrical bus 74. In other embodiments, electrical system 70 may be configured to supply power to a single electrical bus or any number of electrical buses. The electrical bus voltage may be 270 Vdc, +/−270 Vdc or any ac and/or dc voltage suitable for the particular application.

Controller 80 is configured to execute program instructions to control the operation of engine 20, and may be, for example, an engine controller. In other embodiments, controller 80 may take one or more other forms. Controller 80 is operative to receive data from various engine performance and other sensors, actuators and other devices, and to control the operation of engine 20, including fuel flow, the position of any variable geometry systems and other flow control devices (for engines so equipped), based on demand inputs, e.g., from the flight control system of an aircraft. In one form, controller 80 is microprocessor-based and the program instructions are in the form of software stored in a memory (not shown). However, it is alternatively contemplated that the controller and program instructions may be in the form of any combination of software, firmware and hardware, including state machines, and may reflect the output of discreet devices and/or integrated circuits, which may be co-located at a particular location or distributed across more than one location, including any digital and/or analog devices configured to achieve the same or similar results as a processor-based controller executing software or firmware based instructions.

Controller 82 is coupled to controller 80. Controller 82 is the primary controller that regulates the output of electrical system 70, e.g., in response to control inputs from controller 80, and to variations in voltage on electrical bus 72 and/or 74, e.g., to maintain a desired voltage on electrical buses 72 and/or 74. In particular, controller 82 is the primary controller in a primary/secondary relationship with inverter/converter controller 88, inverter/converter controller 90, inverter/converter controller 92, inverter/converter controller 94 and converter controller 98, whereby inverter/converter controller 88, inverter/converter controller 90, inverter/converter controller 92, inverter/converter controller 94 and converter controller 98 control the output of electrical machines 84 and 86, and energy storage system 96, respectively, in response to commands from controller 82. In one form, controller 82 is microprocessor-based and the program instructions are in the form of software stored in a memory (not shown). However, it is alternatively contemplated that the controller and program instructions may be in the form of any combination of software, firmware and hardware, including state machines, and may reflect the output of discreet devices and/or integrated circuits, which may be co-located at a particular location or distributed across more than one location, including any digital and/or analog devices configured to achieve the same or similar results as a processor-based controller executing software or firmware based instructions. In one form, controller 82 is configured to control the output of electrical machines 84 and 86, and energy storage system 96, e.g., via inverter/converter controller 88, inverter/converter controller 90, inverter/converter controller 92, inverter/converter controller 94 and converter controller 98, to minimize parasitic power extraction, increase power generation capability, increase fault tolerance of system 70, and provide electrical transient management. Functions of controller 82 include, in various embodiments, for example, one or more of providing active power management of electrical power generation and storage sources; controlling power transfer between spools, e.g., between HP spool 24 and LP spool 26; power sharing, e.g., as between electrical machines 84 and 86; integrated engine 20 feedback to minimize power extraction affects; and regulating bus voltage to maintain consistent voltage during continuous power demands and also during transient power demands. As a non-limiting example, in one study, bus voltage was 270 Vdc, with transients down to 50 ms power pulses. In one form, controller 82 is a stand-alone controller. In other embodiments, controller 82 or its functions may be incorporated into one or more other controllers, e.g., into controller 80.

Electrical machine 84 is in mechanical communication with HP spool 24, e.g., via shafting system 54. In one form, electrical machine 84 is coupled to HP spool 24 via a gearbox, such as an accessory gearbox. In other embodiments, electrical machine 84 may be coupled to HP spool 24 via other means, with or without a gearbox and/or shafting. In some embodiments, electrical machine 84 may be mounted directly on HP spool 24 or a component of HP spool 24 and/or may be integral with HP spool 24 or a component of HP spool 24. In one form, electrical machine 84 is a starter/generator. In other embodiments, electrical machine 84 may take other forms, and may be, for example, a generator, an alternator and/or a motor. In some embodiments, electrical machine 84 may represent multiple electrical machines in mechanical communication with HP spool 24. As a starter/generator, electrical machine 84 is configured to selectively start engine 20, supply mechanical power to HP spool 24 for other reasons, e.g., for power transfer from LP spool 26 or another source of electrical power, and to extract power from HP spool 24 and convert the mechanical power from HP spool 24 into electrical power, e.g., when engine 20 is running, and in some embodiments, when engine 20 is windmilling. Electrical machine 84 is configured to supply electrical power to electrical buses 72 and 74 in power generation mode. For embodiments wherein electrical machine 84 is a starter generator or motor generator, electrical machine 84 is configured to supply mechanical power to HP spool 24 based on electrical power supplied to electrical machine 84 from electrical bus 72 and/or electrical bus 74, depending upon the particular embodiment.

Electrical machine 86 is in mechanical communication with LP spool 26, e.g., via shafting system 58. In one form, electrical machine 86 is coupled to LP spool 26 via a gearbox. In other embodiments, electrical machine 86 may be coupled to LP spool 26 via other means, with or without a gearbox and/or shafting. In some embodiments, electrical machine 86 may be mounted directly on LP spool 26 or a component of LP spool 26 and/or may be integral with LP spool 26 or a component of LP spool 26. In one form, electrical machine 86 is a motor/generator. In other embodiments, electrical machine 86 may take other forms, and may be, for example, a generator, an alternator and/or a motor. In some embodiments, electrical machine 86 may represent multiple electrical machines in mechanical communication with LP spool 26 and/or an intermediate pressure (IP) spool of an engine having more than two spools. Alternatively, another electrical machine or group of electrical machines may be in mechanical communication with such an IP spool and configured to perform all or part of the functions of electrical machines 84 and/or 86, and may also include the corresponding inverter/controller controllers, e.g., electrically arranged similarly to inverter converter controllers 88, 90, 92 and 94. As a motor/generator, electrical machine 86 is configured to selectively supply mechanical power to LP spool 26, e.g., for power transfer from HP spool 24 or another source of electrical power, and to extract power from LP spool 26 and convert the mechanical power from LP spool 26 into electrical power, e.g., when engine 20 is running, and in some embodiments, when engine 20 is windmilling. Electrical machine 86 is configured to supply electrical power to electrical buses 72 and 74 in power generation mode. For embodiments wherein electrical machine 86 is a motor generator, electrical machine 86 is configured to supply mechanical power to LP spool 26 based on electrical power supplied to electrical machine 86 from electrical bus 72 and/or electrical bus 74, depending upon the particular embodiment. By employing electrical machine 86 to generate electrical power in addition to and in parallel with electrical machine 84, electrical redundancy is provided, as compared to engines supplying power via a single electrical machine. In addition, by employing electrical machine 86 to generate electrical power in addition to and in parallel with electrical machine 84, increased power output relative to the use of a single electrical machine may be achieved in some embodiments.

Inverter/converter controller 88 is electrically coupled to controller 82, electrical machine 84 and to electrical bus 72. Inverter/converter controller 88 is a power electronic inverter/converter including controller functionality, and is configured to self-regulate and adapt the power output of electrical machine 84 into a form suitable for use on electrical bus 72. In one form, inverter/converter controller 88 is configured to provide electrical power from electrical machine 84 to electrical bus 72 in parallel with inverter/converter controller 92 under the direction of controller 82. In other embodiments, inverter/converter controller 88 may be configured to provide electrical power from a plurality of electrical machines to electrical bus 72 under the direction of controller 82. Similarly, in some embodiments, inverter/converter controller 88 may be configured to provide electrical power to a plurality of electrical machines from electrical bus 72 under the direction of controller 82.

Inverter/converter controller 90 is electrically coupled to controller 82, electrical machine 84 and to electrical bus 74. Inverter/converter controller 90 is a power electronic inverter/converter including controller functionality, and is configured to self-regulate and adapt the power output of electrical machine 84 into a form suitable for use on electrical bus 74. In one form, inverter/converter controller 90 is configured to provide electrical power from electrical machine 84 to electrical bus 74 in parallel with inverter/converter controller 94 under the direction of controller 82. In other embodiments, inverter/converter controller 90 may be configured to provide electrical power from a plurality of electrical machines to electrical bus 74 under the direction of controller 82. Similarly, in some embodiments, inverter/converter controller 90 may be configured to provide electrical power to a plurality of electrical machines from electrical bus 74 under the direction of controller 82.

Inverter/converter controller 92 is electrically coupled to controller 82, electrical machine 86 and to electrical bus 72. Inverter/converter controller 92 is a power electronic inverter/converter including controller functionality, and is configured to self-regulate and adapt the power output of electrical machine 86 into a form suitable for use on electrical bus 72. In one form, inverter/converter controller 92 is configured to provide electrical power from electrical machine 86 to electrical bus 72 in parallel with inverter/converter controller 88 under the direction of controller 82. In other embodiments, inverter/converter controller 92 may be configured to provide electrical power from a plurality of electrical machines to electrical bus 72 under the direction of controller 82. Similarly, in some embodiments, inverter/converter controller 92 may be configured to provide electrical power to a plurality of electrical machines from electrical bus 72 under the direction of controller 82.

Inverter/converter controller 94 is electrically coupled to controller 82, electrical machine 86 and to electrical bus 74. Inverter/converter controller 94 is a power electronic inverter/converter including controller functionality, and is configured to self-regulate and adapt the power output of electrical machine 86 into a form suitable for use on electrical bus 74. In one form, inverter/converter controller 94 is configured to provide electrical power from electrical machine 86 to electrical bus 74 in parallel with inverter/converter controller 90 under the direction of controller 82. In other embodiments, inverter/converter controller 94 may be configured to provide electrical power from a plurality of electrical machines to electrical bus 74 under the direction of controller 82. Similarly, in some embodiments, inverter/converter controller 94 may be configured to provide electrical power to a plurality of electrical machines from electrical bus 74 under the direction of controller 82.

Energy storage system 96 is an electrical energy storage device. In one form, energy storage system 96 is a battery. In some embodiments, multiple batteries may be employed. In other embodiments, energy storage system 96 may take one or more other forms in addition to or in place of battery storage, for example and without limitation, one or more ultra-capacitors, one or more flywheel storage systems and/or other energy storage systems. Energy storage system 96 is coupled to electrical bus 72 and electrical bus 74 via converter controller 98. Energy storage system 96 is configured to selectively supply power to electrical bus 72 and electrical bus 74 and absorb power from electrical bus 72 and electrical bus 74, via converter controller 98. In other embodiments, energy storage system 96 may be configured to supply and/or absorb power to/from only electrical bus 72 or electrical bus 74. In one form, energy storage system 96 is configured to absorb transient loads from electrical bus 72 and electrical bus 74. The electrical energy capacity and power absorption rates may vary with the needs of the application, e.g., the anticipated transient loads on electrical bus 72 and electrical bus 74. In some embodiments, energy storage system 96 may be configured to absorb transient loads from electrical bus 72 or electrical bus 74. In one form, energy storage system 96 is configured to provide energy storage for regenerative energy from electrical system 70, and to provide supplemental power to augment the output of electrical machines 84 and 86. In other embodiments, energy storage system 96 may not be so configured, or may be so configured only in part. By employing energy storage system 96 to supply electrical power in addition to and in parallel with electrical machines 84 and 86, additional electrical redundancy is provided. In addition, power may also be supplied from energy storage system 96 to one or both of electrical buses 72 and 74 in the event of a failure that renders one or both of electrical machines 84 and 86 unable to supply power to one or both of electrical buses 72 and 74.

Converter controller 98 is electrically coupled to controller 82, energy storage system 96 and to electrical bus 72 and electrical bus 74. Converter controller 98 a power electronic converter including controller functionality, and is configured to self-regulate and adapt the power output of energy storage system 96 into a form suitable for use on electrical bus 72 and electrical bus 74; and adapt the power output of electrical bus 72 and electrical bus 74 into a form suitable for storage in energy storage system 96. In one form, converter controller 98 is configured to control the amount of electrical power supplied to electrical bus 72 and electrical bus 74 from energy storage system 96 under the direction of controller 82. In other embodiments, converter controller 98 may be configured to control the amount of electrical power supplied to electrical bus 72 or electrical bus 74 from energy storage system 96 under the direction of controller 82. In one form, converter controller 98 is configured to control the amount of electrical power received from electrical bus 72 and electrical bus 74 and supplied to energy storage system 96 for absorption by energy storage system 96 under the direction of the controller 82. In other embodiments, converter controller 98 may be configured to control the amount of electrical power received from electrical bus 72 or electrical bus 74 and supplied to energy storage system 96 for absorption by energy storage system 96 under the direction of controller 82. In one form, converter controller 98 is considered a part of energy storage system 96. In other embodiments, converter controller 98 may disposed elsewhere or otherwise not considered a part of energy storage system 96. In some embodiments, energy storage system 96 is continuously connected to electrical buses 72 and 74 via converter controller 98, but is only enabled during emergency "power fill-in" periods, i.e., is only used intermittently. In other embodiments, energy storage system 96 may be employed continuously, or only during designated events.

During use, engine 20 is started by electrical machine 84. In one form, the power to start engine 20 is supplied by electrical buses 72 and 74. In other embodiments, other power sources may be employed. After being started, both electrical machines 84 and 86 generate electrical power during typical engine operation, and supply the electrical power to electrical buses 72 and 74 via respective inverter/converter controllers 88, 90, 92 and 94. In some embodiments, energy storage system 96 may be used to supply power to one or both of electrical buses 72 and 74 during periods of high demand, e.g., peak demand periods. In such embodiments, the size of one or both of electrical machines 84 and 86 may be reduced, since they would not be required to be sized to handle the peak demand loads. In such embodiments, the capacity of energy storage system 96 may be determined based on anticipated loads that are in excess of the output capacity of electrical machines 84 and 86, e.g., under particular operating conditions.

In some embodiments, electrical system 70 is configured to perform transient load management, e.g., during the operation of engine 20. Generally, electrical transients propagated through the bus network, e.g., one or both of electrical buses 72 and 74, e.g., resulting from the use of components supplied with power from electrical buses 72 and/or 74, may have adverse impact on other components, including reducing component life. Adversely affected components may include engine components, e.g., a generator, accessory gearbox used to drive the generator or one or more other components disposed mechanically or electrically between the electrical bus and the engine spool or shaft that supplies mechanical power to the generator. Damage to mechanical components under such conditions would result from the mechanical loads imposed from the generator in response to the electrical transients. Other adversely affected components may include any or all other components that are coupled to the electrical bus, even those components that are unrelated to the engine. Accordingly, in some embodiments, energy storage system 96 and converter controller 98 are configured to absorb electrical transients from electrical buses 72 and 74 in order to perform transient load management, hence reducing or eliminating the adverse impact of the electrical transients. In some embodiments, accumulator 96 and converter controller 98 may be configured to absorb electrical transients from electrical bus 72 or electrical bus 74 in order to perform transient load management.

In some embodiments, through the use of energy storage system 96, power can be stored and used during times where it would be disadvantageous to extract power (e.g., for electrical power generation) from engine 20 through one or both of electrical machines 84 and 86, e.g., during high thrust mission scenarios, such as take-off conditions, certain maneuvering conditions and/or other flight operations.

In some embodiments, active power management (APM) and reduced or minimized negative engine impact are provided by electrical system 70. In one form, APM functionality is provided via controller 82. For example, in some embodiments, controller 82 manages power flow through electrical system 70 power components, e.g., electrical machine 84, electrical machine 86, inverter/converter controller 88, inverter/converter controller 90, inverter/converter controller 92, inverter/converter controller 94, energy storage system 96 and converter controller 98. In some embodiments, controller 82 is configured to select the appropriate component that minimizes the impact of electrical system 70 components on engine 20, e.g., minimizes impact on the operation of engine 20. Aspects of engine 20 operation for impact consideration include parasitic power off-take, which affects specific fuel consumption (SFC), surge margin (high pressure spool 24, low pressure spool 26 and any intermediate pressure spool for engines so equipped), inter-turbine temperature (ITT), and net thrust, to name a few examples. At different segments of the platform mission, it may be more advantageous to extract power from HP spool 24, whereas at other times it may be more advantageous to extract power from LP spool 26, and in other situations, it may be more advantageous to extract power from both HP spool 24 and LP spool 26. Controller 82 directs power extraction during differing mission segments depending on the positive affect it would have on the engine. For instance, it is sometimes advantageous to extract power form the LP shaft instead of the HP shaft. Under such circumstances, controller 82 would engage electrical machine 86 to provide power to the bus network(s), e.g., electrical buses 72 and 74 instead of using electrical machine 84 to supply the power. In some embodiments, energy storage system 96 (and converter controller 98) is configured to supply power to electrical bus 72 and/or electrical bus 74 during high thrust operations of the gas turbine engine. For example, during mission segments where engine 20 must perform high thrust maneuvers that necessitate a decoupling of parasitic power off-take losses from the engine, controller 82 would direct the energy storage system 96 to provide the bulk of the power necessary to the bus network(s), and direct either electrical machine 84 or electrical machine 86 (whichever one has less of a negative engine impact) to provide the remaining power amount (if energy storage system 96 wasn't sufficient to power the loads on the electrical bus(es)).

In some embodiments, electrical system 70, in particular controller 82, electrical machine 84, electrical machine 86, first inverter/converter controller 88, inverter/converter controller 90, inverter/converter controller 92 and inverter/converter controller 94 are configured for variable power sharing as between the electrical machine 84 and the electrical machine 86 when supplying electrical power to electrical bus 72 and/or electrical bus 74. In some embodiments, electrical system 70 is configured to perform multi-shaft (or multi-spool) power sharing. Controller 82 enables power sharing, whereby both electrical machines 84 and 86 provide power to a shared bus network (e.g., electrical bus 72 and/or electrical bus 74) at the same time. In addition, under the direction of controller 82, electrical machines 84 and 86 may provide power to the electrical buses (e.g., electrical bus 72 and electrical bus 74) at differing power levels, while maintaining bus voltage, yielding variable power sharing. For example, under the direction of controller 82 electrical machines 84 and 86 can provide variable power levels to one or more common bus networks buses (e.g., electrical bus 72 and electrical bus 74), such as a power split of 75% of the electrical load being supplied by electrical machine 86 and 25% of the electrical load being supplied by electrical machine 84. The load split during the power sharing operations may change on the fly, e.g., based on engine operating requirements and electrical load requirements. In various embodiments and/or various operating conditions, the total electrical load supplied to the electrical bus(es) may vary at any point in time between being supplied in the amount of 0-100% by electrical machine 84, with the balance being supplied in the amount of 100%-0, being supplied by electrical machine 86, for a total of 100% supplied to the electrical bus(es) by electrical machine 84 and/or electrical machine 86, yielding dynamic variable power sharing. In other embodiments, power sharing may take place between more than two electrical machines.

In some embodiments, electrical system 70 is configured to perform energy storage charging. Through system 70 and interactive controller 82, energy storage system 96 can be charged through multiple sources, e.g., depending upon the embodiment. Energy storage system 96 is bidirectional capable, thereby being able to absorb power off of the bus network (e.g., electrical buses 72 and/or 74, e.g., at 270 Vdc). Energy storage system 96 is configured to absorb the excess load from the bus(es) via converter controller 98 as the network bus voltage builds in excess of rated voltage, thereby charging energy storage system 96. Excess rated power may be intentionally introduced if the platform actuators were to generate power by closing/opening and the power was put onto the bus allowing for regenerative energy. Also, electrical machines 84 and/or 86 could provide power in excess of that needed by the bus network loads, wherein energy storage system 96 could absorb the excessive load, thereby charging energy storage system 96. The selection of which method (electrical machines 84 and/or 86 and/or actuator power regeneration and/or other charging schemes) may be monitored and/or controlled by controller 82.

In some embodiments, electrical system 70 is configured to transfer power between HP spool 24 and LP spool 26. More particularly, electrical system 70 is configured for shaft power transfer; i.e., power transfer between engine 20 spools, e.g., HP spool 24, LP spool 26 and also an IP spool for engines so equipped. During aggressive aircraft maneuvers or during high power electrical power off-take, power transfer between HP spool 24 and LP spool 26 has shown an increase in HP surge margin and SFC at turbine engine off-design operating points. Power transfer between engine shafts also has potential benefits of maintaining engine compressor operating points (i.e. increased efficiency), increased life expectancy of compressor outlet blades, increased engine thrust response, and fan windmill assist start. Shaft power transfer refers to transferring power between HP and LP spools 24 and 26 (and between one or both spools 24 and 26 and an IP spool for engines so equipped) whereby power is transferred from one spool to the other. Power transfer is achieved by operating one or more electrical machines on one spool as a motor and one or more electrical machines on another spool as a generator, e.g., with the motor(s) being powered by the generator(s), thereby transferring power from one spool to the other. Power could be transferred from LP spool 26 to HP spool 24 under some circumstances, for example, a windmill start; and in other scenarios, power could be transferred from HP spool 24 to LP spool 26, e.g., under maximum takeoff thrust conditions. In some embodiments, e.g., a multi-engine platform, power transfer may include transferring shaft power from one or more spools of one engine to one or more spools of one or more other engines.

In some embodiments, online optimization may be performed: Controller 82 maintains interconnections with engine 70, electrical machine 84, electrical machine 86, and energy storage system 96. Engine 70 performance is a key input to the controller 82, where power extraction from any parasitic power extraction source (electrical machine 84, electrical machine 86, and in embodiments so equipped, an electrical machine on an IP spool, etc.) can negatively affect engine 20 performance (surge margin, fuel efficiency, transient performance, etc.). Controller 82 monitors the engine performance feedback and performs online optimization of all available power sources to provide the required power from the 'best' source or combination of sources. The definition of "best" may include engine performance to maximize surge margin, fuel efficiency, etc; however, "best" will also include power quality, bus stability, transient handling, and combining power sources to a common bus.

In some embodiments, an intermediate pressure (IP) spool may be employed in addition to HP spool 24 and LP spool 26, such as in a three-spool engine. It will be understood that, just as LP spool 26 and HP spool 24 each include at least one electrical machine operative to function as a motor/generator, the same could hold true for the IP spool, which may include at least one electrical machine configured to operate as a motor/generator. The appropriate number of inverter/converter controllers associated with the motor/generator(s) if the IP spool would also be included, e.g., similar to those employed for electrical machines 84 and 86. Accordingly, embodiments described herein with respect to a two-spool engine are applicable to three-spool engines.

In some embodiments, a DEW (Directed Energy Weapon(s)) dedicated bus may be employed. It is contemplated that electrical buses 72 and 74 could both be positive voltage buses, e.g., 270 Vdc, although in other embodiments, one of the two buses may be +270 Vdc, whereas the other may be −270 Vdc. In some embodiments, it is contemplated that a DEW Dedicated Bus may be employed: The ±270 VDC bus can be further modified to include a dedicated DEW bus network at a higher voltage than 270 VDC or even higher than ±270 VDC. For example, in some embodiments, a dedicated DEW bus at a much higher voltage may be required due to mass and volume limitations of distribution cables, e.g., a 1 kv bus voltage.

Embodiments of the present disclosure include a gas turbine engine, comprising: a high pressure spool; a low pressure spool; and an electrical system configured to supply power in parallel to a first electrical bus and a second electrical bus, including: a first controller configured to control operation of the gas turbine engine; a second controller coupled to the first controller; a first electrical machine in mechanical communication with the high pressure spool; a second electrical machine in mechanical communication with the low pressure spool; a first inverter/converter controller coupled to the second controller, the first electrical machine and one the first electrical bus and the second electrical bus, and configured to provide electrical power to the one the first electrical bus and the second electrical bus under direction of the second controller; a second inverter/converter controller coupled to the second controller, the second electrical machine, the other of first electrical bus and the second electrical bus, and configured to provide electrical power to the other of the first electrical bus and the second electrical bus under the direction of the second controller; an energy storage system configured to supply power to and absorb power from at least one of the first electrical bus and the second electrical bus; and a converter controller coupled to the energy storage system, the second controller and the at least one of the first electrical bus and the second electrical bus, wherein the converter controller is configured to control the amount of electrical power supplied to the at least one of the first electrical bus and the second electrical bus from the energy storage system under the direction of the second controller; and to control the amount of electrical power received from the at least one of the first electrical bus and the second electrical bus and supplied to the energy storage system under the direction of the second controller.

In a refinement, the gas turbine engine of further comprises a third inverter/converter controller coupled to the second controller, the first electrical machine and the other of first electrical bus and the second electrical bus, and configured to provide electrical power to the other of first electrical bus and the second electrical bus in parallel with the second inverter/converter controller under the direction of the second controller.

In another refinement, the gas turbine further comprises a fourth inverter/converter controller coupled to the second controller, the second electrical machine, and the one the first electrical bus and the second electrical bus, and configured to provide electrical power to the one the first electrical bus and the second electrical bus in parallel with the first inverter/converter controller under direction of the second controller.

In yet another refinement, the first electrical machine is a starter/generator.

In still another refinement, the energy storage system is configured to absorb transient loads on the first electrical bus and/or the second electrical bus.

In yet still another refinement, the second controller, the first electrical machine, the second electrical machine, the first inverter/converter controller and the second inverter/converter controller are configured for variable power sharing as between the first electrical machine and the second electrical machine when supplying electrical power to the first electrical bus and/or the second electrical bus.

In a further refinement, the electrical system is configured to regulate a voltage of the first electrical bus and/or the second electrical bus.

In a yet further refinement, the electrical system is configured to transfer power between the high pressure spool and the low pressure spool.

In a still further refinement, the energy storage system is configured to supply power to the first electrical bus and the second electrical bus during high thrust operations of the gas turbine engine.

Embodiments of the present disclosure include a machine, comprising: a first rotor; a second rotor; and an electrical system configured to supply power in parallel to an electrical bus, including: a first controller configured to control operation of the machine; a second controller coupled to the first controller; a first electrical machine in mechanical communication with the first rotor; a second electrical machine in mechanical communication with the second rotor; a first inverter/converter controller coupled to the second controller, the first electrical machine and the electrical bus, and configured to provide electrical power to the electrical bus under the direction of the second controller; a second inverter/converter controller coupled to the second controller, the second electrical machine and the electrical bus, and configured to provide electrical power to the electrical bus under the direction of the second controller; an energy storage system configured to supply power to and absorb power from the electrical bus; and a converter controller coupled to the energy storage system, the second controller and the electrical bus, wherein the converter controller is configured to control the amount of electrical power supplied to the electrical bus from the energy storage system under the direction of the second controller; and configured to control the amount of electrical power received from the electrical bus and supplied to the energy storage system under the direction of the second controller.

In a refinement, the machine further comprises a third inverter/converter controller coupled to the second controller, the first electrical machine and the electrical bus, and configured to provide electrical power to the electrical bus in parallel with the first inverter/converter controller under direction of the second controller.

In a another refinement, the machine further comprises a fourth inverter/converter controller coupled to the second controller, the second electrical machine and the electrical bus, and configured to provide electrical power to the electrical bus in parallel with the second inverter/converter controller under direction of the second controller.

In yet another refinement, the first electrical machine is a starter/generator.

In still another refinement, the energy storage system is configured to absorb transient loads on the electrical bus.

In yet still another refinement, the second controller, the first electrical machine, the second electrical machine, the first inverter/converter controller and the second inverter/converter controller are configured for variable power sharing as between the first electrical machine and the second electrical machine when supplying electrical power to the electrical bus.

In a further refinement, the electrical system is configured to regulate a voltage of the electrical bus.

In a yet further refinement, the electrical system is configured to transfer power between the first rotor and the second rotor.

In a still further refinement, the energy storage system is configured to supply power to the electrical bus during high output operations of the machine.

Embodiments of the present disclosure include a gas turbine engine, comprising: a high pressure spool; a low pressure spool; and means for supplying power to an electrical bus.

In a refinement, the means for supplying power includes a first electrical machine coupled to the high pressure spool for supplying power to the electrical bus; a second electrical machine coupled to the low pressure spool for supplying power to the electrical bus; and an energy storage system coupled to the electrical bus; wherein the first electrical machine, the second electrical machine and the energy storage system are configured to supply power simultaneously to the electrical bus; wherein the energy storage system is configured to absorb transient loads from the electrical bus; and wherein the energy storage system is configured to be charged by the electrical bus.

While the disclosure has been described in connection with what is presently considered to be the most practical and preferred embodiment, it is to be understood that the disclosure is not to be limited to the disclosed embodiment(s), but on the contrary, is intended to cover various modifications and equivalent arrangements included within the spirit and scope of the appended claims, which scope is to be accorded the broadest interpretation so as to encompass all such modifications and equivalent structures as permitted under the law. Furthermore it should be understood that while the use of the word preferable, preferably, or preferred in the description above indicates that feature so described may be more desirable, it nonetheless may not be necessary and any embodiment lacking the same may be contemplated as within the scope of the disclosure, that scope being defined by the claims that follow. In reading the claims it is intended that when words such as "a," "an," "at least one" and "at least a portion" are used, there is no intention to limit the claim to only one item unless specifically stated to the contrary in the claim. Further, when the language "at least a portion" and/or "a portion" is used the item may include a portion and/or the entire item unless specifically stated to the contrary.

What is claimed is:

1. A method of generating power in a gas turbine engine, comprising:
 coupling a first electrical machine in parallel to both a primary electrical bus and to a secondary electrical bus via a first pair of inverter/converter controllers, the first pair of inverter/converter controllers comprising a first inverter/converter controller and a second inverter/converter controller, the first inverter/converter controller coupled to the primary electrical bus, the second inverter/converter controller coupled to the secondary electrical bus, the first electrical machine being coupled to the gas turbine engine;
 coupling a second electrical machine in parallel to both the primary electrical bus and to the secondary electrical bus via a second pair of inverter/converter controllers, the second pair of inverter/converter controllers comprising a third inverter/converter controller and a fourth inverter/converter controller, the third inverter/converter controller coupled to the primary electrical bus, the fourth inverter/converter controller coupled to the secondary electrical bus, the second electrical machine being coupled to the gas turbine engine;

configuring a first controller to receive data from the gas turbine engine to control operation of the gas turbine engine;

coupling a second controller to the first controller;

configuring the second controller to control an electrical output of the first and second electrical machines to the primary and secondary electrical busses;

coupling a converter controller to an energy storage system, the second controller, the primary electrical bus, and the secondary electrical bus; and configuring the converter controller to control an amount of electrical power, under direction from the second controller, passing between the energy storage system and the primary and secondary electrical busses.

2. The method of claim 1, further comprising coupling the first electrical machine to a high pressure spool of the gas turbine engine, and coupling the second electrical machine to a low pressure spool of the gas turbine engine.

3. The method of claim 2, wherein the first electrical machine is one of a generator, an alternator, or a motor, and is in mechanical communication with the high pressure spool.

4. The method of claim 1, wherein at least one of the first electrical machine or the second electrical machine is a starter/generator configured to selectively start the gas turbine engine.

5. The method of claim 4, wherein each of the first and second electrical machines is a starter/generator, the first electrical machine being coupled to a high pressure spool of the gas turbine engine, and the second electrical machine being coupled to a low pressure spool of the gas turbine engine.

6. The method of claim 1, wherein the second controller controls each of the first inverter/converter controller and the third inverter/converter controller to self-regulate and adapt power output of the first and second electrical machines to the primary electrical bus.

7. The method of claim 1, wherein the second controller, the first electrical machine, the second electrical machine, the first inverter/converter controller, the second inverter/converter controller, the third inverter/converter controller, and the fourth inverter/converter controller are configured for variable power sharing.

8. The method of claim 1, wherein the energy storage system is configured to absorb transient loads on the primary electrical bus and the secondary electrical bus.

9. An electrical system coupled to a gas turbine engine, and to a primary electrical bus and a secondary electrical bus, the electrical system comprising:

a first electrical machine and a second electrical machine, the first and second electrical machines coupled to the gas turbine engine, the first electrical machine electrically coupled in parallel to both the primary electrical bus and to the secondary electrical bus via a first pair of inverter/converter controllers, and the second electrical machine electrically coupled in parallel to both the primary electrical bus and to the secondary electrical bus via a second pair of inverter/converter controllers;

a first controller configured to control operation of the gas turbine engine;

a second controller coupled to the first controller, the second controller configured to respond to control inputs from the first controller and control an electrical output of the first and second electrical machines to the primary and secondary electrical busses;

an energy storage system; and a converter controller coupled to the energy storage system, the second controller, the primary electrical bus, and the secondary electrical bus;

wherein the converter controller is configured to control an amount of electrical power, under direction from the second controller, passing between the energy storage system and at least one of the primary and secondary electrical busses, wherein the first pair of inverter/converter controllers comprises a first inverter/converter controller and a second inverter/converter controller, the first inverter/converter controller coupled to the primary electrical bus, the second inverter/converter controller coupled to the secondary electrical bus, and wherein the second pair of inverter/converter controllers comprises a third inverter/converter controller and a fourth inverter/converter controller, the third inverter/converter controller coupled to the primary electrical bus, the fourth inverter/converter controller coupled to the secondary electrical bus.

10. The electrical system of claim 9, wherein:

the energy storage system is configured to absorb transient loads on the primary electrical bus and the secondary electrical bus, and the second controller, the first electrical machine, the second electrical machine, the first inverter/converter controller, the second inverter/converter controller, the third inverter/converter controller, and the fourth inverter/converter controller are configured for variable power sharing.

11. A gas turbine engine, comprising:

a low pressure spool;

a high pressure spool;

a first electrical machine and a second electrical machine, the first and second electrical machines being coupled to the gas turbine engine, each of the first and second electrical machines electrically coupled to both a primary electrical bus and a secondary electrical bus, the first electrical machine coupled in parallel to both the first primary electrical bus and to the secondary electrical bus via a first pair of inverter/converter controllers, and the second electrical machine coupled in parallel to both the primary electrical bus and to the secondary electrical bus via a second pair of inverter/converter controllers;

a first controller configured to control operation of the gas turbine engine;

a second controller coupled to the first controller, the second controller configured to respond to control inputs from the first controller and control an electrical output of the first and second electrical machines to the primary and secondary electrical busses; and a converter controller coupled to an energy storage system, the second controller, the primary electrical bus, and the secondary electrical bus, wherein the converter controller is configured to control an amount of electrical power passing between the energy storage system and at least one of the primary and secondary electrical busses in response to an input from the second controller, wherein the first pair of inverter/converter controllers comprises a first inverter/converter controller and a second inverter/converter controller, the first inverter/converter controller coupled to the primary electrical bus, the second inverter/converter controller coupled to the secondary electrical bus, and wherein the second pair of inverter/converter controllers comprises a third inverter/converter controller and a fourth inverter/converter controller, the third inverter/converter controller coupled to the primary electrical bus, the fourth inverter/converter controller coupled to the secondary electrical bus.

12. The gas turbine engine according to claim 11, wherein the first electrical machine is coupled to the high pressure spool of the gas turbine engine, and the second electrical machine is coupled to the low pressure spool of the gas turbine engine.

13. The gas turbine engine according to claim 11, wherein the first electrical machine is one of a generator, an alternator, or a motor, and is in mechanical communication with the high pressure spool.

14. The gas turbine engine according to claim 11, wherein at least one of the first electrical machine or the second electrical machine is a starter/generator configured to selectively start the gas turbine engine.

15. The gas turbine engine according to claim 11, wherein the first electrical machine is a first starter/generator coupled to the high pressure spool, the second electrical machine is a second starter/generator coupled to the low pressure spool, and the first starter/generator is configured to selectively start the gas turbine engine.

16. The gas turbine engine according to claim 11, wherein the second controller controls each of the first inverter/converter controller and the third inverter/converter controller to self-regulate and adapt power output of the first and second electrical machines to the primary electrical bus.

17. The gas turbine engine according to claim 11, wherein the second controller, the first electrical machine, the second electrical machine, the first inverter/converter controller, the second inverter/converter controller, the third inverter/converter controller, and the fourth inverter/converter controller are configured for variable power sharing.

* * * * *